(12) United States Patent
Silvano De Sousa et al.

(10) Patent No.: US 10,763,423 B2
(45) Date of Patent: Sep. 1, 2020

(54) MEMS PIEZOELECTRIC TRANSDUCER FORMED AT A PCB SUPPORT STRUCTURE

(71) Applicant: AT&S Austria Technologie & Systemtechnik Aktiengesellschaft, Leoben (AT)

(72) Inventors: Jonathan Silvano De Sousa, Vienna (AT); Nick Renaud-Bezot, Vienna (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 601 days.

(21) Appl. No.: 15/411,971

(22) Filed: Jan. 21, 2017

(65) Prior Publication Data

US 2017/0213955 A1 Jul. 27, 2017

(30) Foreign Application Priority Data

Jan. 21, 2016 (EP) ..................................... 16290016

(51) Int. Cl.
*H01L 41/053* (2006.01)
*H01L 41/09* (2006.01)
(Continued)

(52) U.S. Cl.
CPC .......... *H01L 41/053* (2013.01); *B81B 3/0021* (2013.01); *B81C 1/00333* (2013.01); *H01L 41/0477* (2013.01); *H01L 41/09* (2013.01); *H01L 41/0973* (2013.01); *H01L 41/113* (2013.01); *H01L 41/311* (2013.01); *H01L 41/312* (2013.01); *H04R 17/00* (2013.01); *H04R 31/00* (2013.01); *B81B 2201/0235* (2013.01); *B81B 2203/0127* (2013.01); *B81B 2207/012* (2013.01); *H04R 2201/003* (2013.01)

(58) Field of Classification Search
CPC ... H01L 41/053; H01L 41/0477; H01L 41/09; H01L 41/0973; H04R 17/00
USPC .................................................. 310/329, 348
See application file for complete search history.

(56) References Cited

U.S. PATENT DOCUMENTS

| 5,759,753 A | 6/1998 | Namba et al. |
| 2004/0027033 A1* | 2/2004 | Schiller ............... G01P 15/0922 310/329 |

(Continued)

FOREIGN PATENT DOCUMENTS

| CN | 1865864 A | 11/2006 |
| JP | 2010077317 A | 4/2010 |

OTHER PUBLICATIONS

Wu Yuping, Xianfei, Electronic Assembly Technology, Dec. 31, 2006, pp. 70-71, Huazhong University of Science & Technology Press, Wuhan, China.

(Continued)

*Primary Examiner* — Derek J Rosenau
(74) *Attorney, Agent, or Firm* — Robert A. Blaha; Smith Tempel Blaha LLC

(57) ABSTRACT

A microelectro-mechanical system (MEMS) device includes a support structure formed of printed circuit board (PCB) materials; and a piezoelectric transducer formed at the support structure. Further, a MEMS assembly is described which shows such a MEMS device mounted at a component carrier. Furthermore, a method for manufacturing such a MEMS device is described.

20 Claims, 2 Drawing Sheets

(51) Int. Cl.

| | | |
|---|---|---|
| *H01L 41/312* | (2013.01) | |
| *H04R 17/00* | (2006.01) | |
| *H01L 41/311* | (2013.01) | |
| *H04R 31/00* | (2006.01) | |
| *B81B 3/00* | (2006.01) | |
| *B81C 1/00* | (2006.01) | |
| *H01L 41/047* | (2006.01) | |
| *H01L 41/113* | (2006.01) | |

(56) References Cited

U.S. PATENT DOCUMENTS

| | | | |
|---|---|---|---|
| 2006/0244789 A1 | 11/2006 | Li | |
| 2008/0049955 A1* | 2/2008 | Fujiwara | H04R 17/00 381/190 |
| 2008/0218031 A1* | 9/2008 | Kuroda | H04R 17/10 310/334 |
| 2011/0140578 A1* | 6/2011 | Ko | B60C 23/0411 310/339 |
| 2011/0292124 A1 | 12/2011 | Anderson et al. | |
| 2012/0161585 A1 | 6/2012 | Nakahara | |
| 2015/0258573 A1* | 9/2015 | Kojima | G10K 11/002 310/327 |

OTHER PUBLICATIONS

Notification of First Office Action, Application No. 201710053988.1, The State Intellectual Property Office of P.R. of China, dated Jun. 5, 2018, 3pp.

\* cited by examiner

MEMS PIEZOELECTRIC TRANSDUCER FORMED AT A PCB SUPPORT STRUCTURE

This application claims the benefit of the filing date of European Patent Application No. 16 290 016.1 filed 21 Jan. 2016, the disclosure of which is hereby incorporated herein by reference.

TECHNICAL FIELD

Embodiments of the present invention relate to the technical field of microelectro-mechanical systems (MEMS) and methods for producing the same.

TECHNOLOGICAL BACKGROUND

Microelectro-mechanical systems (MEMS) are used for miniaturized apparatuses and assembly groups, which are realized within very small dimensions and which comprise components which cooperate with each other towards a specific functionality. Typically, a MEMS consists of one or more sensors or actuators and an electronic control circuit which are all realized on a common semiconductor substrate. The size of the entire MEMS is typically in the order of a few micrometers. MEMS may be used for any type of application which requires a mechanical interaction between (a) a mechanical component, e.g. a mechanical sensor or an actuator, and (b) an electronic circuit connected thereto.

Generally speaking, MEMS are electromechanical structures which are built up by standard semiconductor processes. Due to the large importance of MEMS in many applications MEMS-specific equipment and processes have been developed in order to optimize the cost and the performance of MEMS devices. For that reason, the main substrate for modern MEMS devices is Si, as it is a common and easy-to-process material. However, in the wide field of MEMS also other materials are known to be used such as SiC, diamond, or quartz. A good choice for a proper material may depend on temperature requirements or intrinsic material properties.

SUMMARY

There may be a need to further optimize the performance and in particular the cost efficiency for building up MEMS devices.

This need may be met by the subject matter according to the independent claims. Advantageous embodiments of the present invention are described by the dependent claims.

According to a first aspect of the invention there is provided a microelectromechanical system (MEMS) device comprising (a) a support structure formed of printed circuit board, PCB, materials; and (b) a piezoelectric transducer formed at the support structure.

Overview of the MEMS Piezoelectric Transducer

The described MEMS device is based on the idea that piezoelectric materials such as for instance lead zirconate titanate (PZT) or Aluminum Nitride (AlN) can be directly deposited on typical PCB materials such as Cu and Polymers (e.g. FR4). By relying on PCB materials for a support structure for MEMS for fabrication of a plurality of MEMS devices the output regarding the number of MEMS devices produced within one batch can be very high. By contrast to semiconductor wafers having a diameter in the order of for instance 150 mm PCBs can have a much larger size. PCB production processes typically rely on and operate with a panel size of 18 inch×24 inch (=45.72 cm×60.96 cm) and bigger. Under the assumption of equal processing times for simultaneously building up a plurality of MEMS devices a corresponding change of the "production format" alone would result in an output increase by a factor 15.

Further, a typical PCB base material is typically much cheaper than a silicon (Si) wafer. On the one hand this allows for a cheap production of MEMS products. On the other hand, for approximately the same production costs, larger MEMS devices can be produced, which generally have a higher sensitivity or efficiency. In numbers, a higher-end FR4 panel presently costs about 20 US$ or $7 \times 10^{-5}$ US$ per $mm^2$. By contrast thereto, a 150 mm Si wafer costs about 200 US$ or 0.02 US$ per $mm^2$. This means that using the PCB material FR4 for realizing the support structure for the piezoelectric transducer is 99.5% cheaper than using silicon for the same purpose.

Furthermore, an integration of a plurality of MEMS devices within a certain area can be realized in a simple manner by known PCB manufacturing processes. For instance, realizing a "front end-to-back end" interconnection by so called Plated Through Holes (PTHs) is much cheaper than realizing a corresponding interconnection in Si by so called "Through Silicon Vias" (TSVs).

Furthermore, additional electronic circuits realized by one or more electronic components can be simply added by applying well established Surface Mount Technology (SMT) and/or by embedding. This simplifies an integration of the described MEMS device within an electronic environment given by one or more electronic components.

For realizing a potentially necessary additional structuring resulting e.g. in back-volumes, cavities, channels, etc., a drilling or milling of the PCB support structure can be performed. Corresponding structures can be formed not only by mechanical tools but also for instance by laser drilling and/or laser ablation and/or plasma etching. Such well-established structuring procedures can be realized much cheaper and/or much faster as compared to comparatively costly and lengthy wet or dry etch processes which are typically used for forming MEMS on or at semiconductor materials.

The support structure may be any physical structure which is capable of providing a necessary mechanical support for the piezoelectric transducer. In accordance with embodiments of the invention this support structure is formed (at least partially) from PCB materials, whereby PCB materials are those materials which are used for forming or building up printed circuit boards.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. A PCB mechanically supports and electrically connects electronic components using conductive tracks, pads and other features etched from electrically conductive or metal layers which are typically copper layers. PCBs can be single sided (one metal layer), double sided (two metal layers) or multi-layer (outer and inner metal layers). Multi-layer PCBs allow for a significant increase of the integration density of electronic assemblies. Conductors at different layers are connected with metallized or plated through holes or blind holes, all called vias.

As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole or blind-hole connections.

Apart from one or more electronic components which may be embedded in a printed circuit board, a printed circuit board is usually configured for accommodating one or more electronic components on one or both opposing surfaces of the plate-shaped printed circuit board. The at least one electronic component may be connected to the respective main surface by soldering.

In this document the term "transducer" may denote any electromechanical device which converts electric energy into mechanic energy or vice versa mechanic energy into electric energy. Specifically, a transducer may be an actuator which, under the impact of an electric quantity such as voltage, generates a movement of a moving part of the MEMS. Alternatively, a transducer may be a sensor which translates mechanical energy, e.g. a movement of a moving part of the MEMS, into an electric quantity (e.g. voltage). Thereby, the mechanical energy may also be a potential energy given by a relative position between the moving MEMS part and an electric reference part. In the latter case the electric quantity is typically a voltage representing the output signal of a corresponding MEMS sensor.

A "piezoelectric transducer" may be in particular a transducer wherein mechanical energy is translated into electric energy or vice versa by means of a piezoelectric material. A piezoelectric material may be e.g. a crystalline quartz material, lead titanate (PbTiO3), Gallium orthophosphate (GaPO4), Barium titanate (BaTiO3), lead zirconate titanate (PZT), or a lead-free piezoceramic material such as Bismuth ferrite (BiFeO3). Although presently not being considered as optimal candidates semiconductor materials such as GaN, InN, AlN and ZnO can also be used to form the piezoelectric transducer. Further, for instance the polymer material Polyvinylidene fluoride (PVDF) can be used.

According to an embodiment of the invention the PCB materials comprise at least one of the group consisting of resin, in particular Bis-maleimide-Triazine resin, cyanate ester, glass, in particular glass fibers, prepreg material, liquid crystal polymer, epoxy-based Build-Up Film, FR4 material, a ceramic, and a metal oxide. Although prepreg or FR4 are preferred, the other mentioned material or still other materials may be used as well.

It is mentioned that, of course, a good choice for a proper material takes into account desired characteristics of the PCB material, typically in comparison with or in relation to characteristics of the employed piezoelectric material. Such characteristics may be for instance (a) the Coefficient of Thermal Expansion (CTE), (b) the flexibility or the modulus of elasticity, (c) the glass transition temperature, and/or (d) the absorption coefficient for electromagnetic radiation, in particular for electromagnetic radiation in the radio frequency regime.

According to a further embodiment of the invention at least one of the PCB materials comprises a linear coefficient of thermal expansion (CTE) at 20° C. being in the range (a) between $2.0 \times 10^{-6}$/K and $3.1 \times 10^{-6}$/K, in particular (b) between $2.2 \times 10^{-6}$/K and $2.9 \times 10^{-6}$/K, further in particular (c) between $2.4 \times 10^{-6}$/K and $2.7 \times 10^{-6}$/K and even further in particular (d) at least approximately $2.56 \times 10^{-6}$/K. This may provide the advantage that the at least one employed PCB material more or less closely matches with the CTE of Silicon (Si). Therefore, Si can be used for components which are directly or indirectly connected to the piezoelectric transducer while problems regarding temperature dependencies in particular for MEMS sensor applications can be avoided at least significantly reduced.

Using PCB material(s) with the specified CTE allows to replace at least some of the semiconductor material Si exclusively used for known MEMS devices by PCB material(s). This may provide that advantage that well-established PCB process technologies can be applied for forming the described MEMS device. Preferably, more than one or even all employed PCB materials fulfill at least approximately these requirements.

According to a further embodiment of the invention at least one of the PCB materials comprises a modulus of elasticity which is smaller than the modulus of elasticity if silicon.

Descriptively speaking, the at least one and preferably all employed PCB materials are softer than the semiconductor material Si which, as described above, may be used at least for certain components of the MEMS device the components of which are directly or indirectly mechanically connected or coupled to the piezoelectric transducer. This allows for buffering and/or dampening mechanical stress between different components of the described MEMS device.

According to a further embodiment of the invention the piezoelectric transducer is made at least partially from aluminum nitride (AlN).

Using AlN as piezoelectric material for the piezoelectric transducer may provide the advantage that, by contrast to many other piezoelectric materials, this material can be deposited in an comparatively easy but reliable manner on many types pf PCB materials. In particular, AlN is suitable for being deposited onto FR4 material, which, as has been mentioned above, is a very common material for forming PCBs. Therefore, the described MEMS device using AlN for the piezoelectric transducer can be produced while taking benefit from well-established PCB manufacturing processes.

A deposition of AlN at or onto FR4 material can be realized for instance by means of a sputtering procedure.

According to a further embodiment of the invention the MEMS device further comprises a layer of copper (Cu), whereby AlN is formed at the layer of Cu. This may provide the advantage that a deposition of the AlN at or onto at least one PCB material (of a layered structure of the entire MEMS device) can be realized in an easy and effective manner. From the perspective of processing the described Cu layer may be a (structured) Cu foil which usually represents a half-finished product for manufacturing PCBs.

In this respect it is pointed out that the inventors of the MEMS device described in this document have found out that surprisingly the piezoelectric material AlN is characterized by a very good adhesion to the material Cu. Since, as has already been mentioned above, Cu layers are widely used for manufacturing PCBs, using AlN for the piezoelectric transducer allows for building up the described MEMS device while relying predominantly on well-established PCB production processes.

Depending on the concrete design of the described MEMS device the Cu layer may be assigned, from the perspective of producing the MEMS device, either to the support structure or to the piezoelectric transducer. In both cases the Cu layer serves as a binding structure for combining, in a mechanically reliable manner, the AlN with at least one of the PCB materials, in particular FR4.

In case one assigns the Cu layer to the piezoelectric transducer the respective Cu foil may be bonded to the organic base of the support structure via typical PCB manufacturing processes including a pressing and/or a Cu etching procedure.

In this context it is mentioned that using an intermediate Cu layer for indirectly attaching or forming the AlN layer at FR4 reduces the heat load onto FR4 which usually occurs when processing AlN with a comparatively high temperature being necessary for a deposition of AlN. Thereby, a formation of a AlN layer at the Cu foil can be done before attaching the Cu foil (together with the AlN) at the FR4 material.

According to a further embodiment of the invention the AlN has been formed at the layer of Cu by a sputtering procedure. This may provide the advantage that a reliable and well-established procedure can be used for depositing the piezoelectric AlN material onto the Cu layer. Further, it has been turned out that sputtering also results in a mechanically stable connection between these materials. These benefits may result from the matter of fact that sputtering allows for a deposition of AlN at Cu under comparatively low temperatures which reduces the above described heat load acting in particular to the PCB material FR4.

According to a further embodiment of the invention the piezoelectric transducer is a layer structure which is embedded at least partially within the support structure. This may provide the advantage that the physical structure of the piezoelectric transducer, which may be mechanically very sensitive or damageable, will be protected (at least partially) by the PCB material(s) of the support structure.

The term "layer structure" may particularly mean that the piezoelectric transducer is a flat structure, the thickness of which is much smaller than its lateral dimensions (e.g. its length and its width).

In the context of this document "embedded" may mean in particular that the piezoelectric transducer comprises fixation portions, which are covered at two opposing sides or surfaces by the at least one PCB material. Again, the PCB material may be preferably FR4.

Descriptively speaking, according to the embodiment described here parts of the piezoelectric transducer may be "clamped" by PCB material, in particular by two different PCB material layer structures. Preferably, in a cross sectional view of the MEMS device there are at least two separate fixation portions which are directly or indirectly clamped by two PCB material layer portions being assigned to different layers of the support structure made from PCB materials. In order allow for a sensitive (in a sensor application) or for an effective (in an actuator application) interaction between the piezoelectric transducer and the external environment of the MEMS device there may be provided also interaction portions of the piezoelectric transducer which are (at least not from two opposite sides) not in mechanical contact with PCB material.

According to a further embodiment of the invention the MEMS device further comprises an opening which is formed within the support structure and which is designed in such a manner that an interaction portion of the piezoelectric transducer is exposed to an external environment of the MEMS device. This may allow for a direct mechanical interaction between the piezoelectric transducer of the MEMS device and a physical quantity characterizing the actual state of the environment.

In this respect the term "environment" has to be understood in a broad manner. Depending on the specific application the environment may be simply the surrounding air or the surrounding atmosphere of the MEMS device (e.g. in case the MEMS device is a pressure sensor or a loudspeaker which does not employ a membrane). However, environment may also be given by micromechanical structures such as a micro lever or a set of micro levers.

The term "opening" may denote any type of recess or cavity formed in or at the support structure. The opening might even be a metallized (plated) or non-metallized via formed within the support structure. The opening may be formed within the respective part of the support structure for instance by drilling or milling, wherein both can be accomplished with mechanical tools and/or with appropriate laser radiation. Alternatively or in combination a plasma etching procedure may be used.

According to a further embodiment of the invention the MEMS device further comprises a further opening which is formed within the support structure and which is designed in such a manner that a further interaction portion of the piezoelectric transducer is exposed to the external environment or to a further external environment of the MEMS device. Thereby, with respect to a main plane of the layer structure of the piezoelectric transducer the interaction portion and the further interaction portion are located at opposite sides. This design may provide the advantage that even in case of a comparatively small openings (i.e. opening and further opening) the efficiency or the strength of a mechanical interaction between the environment of the MEMS device (i.e. the external environment and possibly the further external environment of the MEMS device) can be comparatively high. In other words, the size of the mechanically unprotected interaction portions (i.e. interaction portion and further interaction portion) can be kept comparatively small. As a consequence, the mechanical robustness of the entire MEMS device will be high which increases the number of applications the described MEMS device can be used for.

Preferably, the MEMS device is realized with an at least partially symmetric design with respect to the main plane of the layer structure of the piezoelectric transducer. Such symmetry can be realized with a formation of two openings (i.e. the above described opening and the above described further opening) which face each other. This means that with respect to any direction within the main plane there is a maximum spatial overlap between the opening and the further opening.

According to a further embodiment of the invention the MEMS device further comprises a flexible membrane spanning the opening, wherein at least a portion of the membrane is mechanically coupled with or is coupleable to the piezoelectric transducer. This may provide the advantage that the piezoelectric transducer can be protected from unwanted external impacts. Further, due to the described flexibility of the membrane physical quantities characterizing the environment can be transferred to the piezoelectric transducer without a larger attenuation or damping. Using such a flexible membrane may be in particular of advantage in case the described MEMS device is used for pressure measurement applications.

According to a further embodiment of the invention the flexible membrane comprises silicone and/or Polycrystalline Si and in particular doped Polycrystalline Si. This may provide the advantage that the production of the flexible membrane can be integrated, of course with additional process steps, into the production of other parts of the described MEMS device.

Preferably, the membrane is made completely from Polycrystalline Si and in particular from doped Polycrystalline Si. This may provide the advantage that process steps well-known in the PCB and in particular in the semiconductor industry can be employed.

According to a further embodiment of the invention the MEMS device further comprises an inertial element which is attached to the interaction portion of the piezoelectric transducer.

The inertial element may be any physical structure which comprises a certain mass and which produces an inertial force as soon as the MEMS device is accelerated. This means that with the described MEMS device the strength of accelerations can be measured, wherein the sensitivity of the corresponding MEMS acceleration sensor will be maximized if the direction of acceleration is at least approximately perpendicular to the (main) plane of the layer structure of the piezoelectric transducer.

According to a further aspect of the invention there is provided a MEMS assembly which comprises (a) a component carrier; and (b) a MEMS device as described above, wherein the MEMS device is mounted at the component carrier.

The described MEMS assembly is based on the idea that the above elucidated MEMS device can be easily and with well-known and well-established PCB manufacturing procedures attached to a component carrier which can be used as a mounting base for electronic components in order to build up an electronic circuit. In the case of an actuator application the electronic circuit may be used for driving the piezoelectric transducer of the MEMS device in order to produce a movement of a mechanical micro component being coupled to the piezoelectric transducer. In the case of a sensor application the electronic circuit mounted on or at the component carrier may receive and process electric signals which are produced in response to the mechanical movement of the piezoelectric transducer. Again, this mechanical movement can be generated by the movement of a mechanical micro component being coupled to the piezoelectric transducer.

The component carrier may be a PCB. Preferably, the PCB is made from the same PCB materials as the support structure. This may provide the advantage that with regard to a processing of the entire MEMS assembly the component carrier and the support structure can be formed with the same type of PCB processing steps. This allows for a very efficient production of the described MEMS assembly.

According to a further embodiment of the invention the MEMS assembly further comprises an electronic circuit, which is mounted at the component carrier and which is electrically connected with the MEMS device.

The electronic circuit may comprise one or more electronic components which may be mounted at a surface of the component carrier. Alternatively or in combination at least one of these components may be embedded within the component carrier.

The MEMS assembly described with this embodiment may form a closed and/or autarkic module representing either a MEMS actuator or a MEMS sensor.

In case of an actuator application the MEMS assembly may be for instance at least a part of a loudspeaker, a micro-pump, a liquid or viscous media applicator usable for instance for inkjet applications, a micro-cantilever device, a positioning device e.g. for positioning micro-mirror and/or micro lens (autofocus applications), an electrical switch, a variable capacitor, etc.

In case of a sensor application the MEMS assembly may be for instance at least a part of a microphone, an acceleration sensor, a pressure sensor, a haptic sensor, a magnetic field sensor, a chemical sensor, a gyroscope etc.

Although not being literally a sensor application also a micro energy harvesting might be a promising "sensor" application for the described MEMS assembly because also here with the MEMS device mechanical energy is captured and transformed into electric energy.

It is pointed out that the above given enumeration is not complete and the described MEMS assembly can be used also for other purposes.

According to a further aspect of the invention there is provided a method for manufacturing a MEMS device. The provided method comprises (a) forming a support structure from PCB materials by using PCB manufacturing procedures; and (b) forming a piezoelectric transducer at the support structure.

Also the provided method is based on the idea at least some piezoelectric materials can be directly or indirectly (e.g. via an intermediate metal layer) deposited on or at typical PCB materials. By contrast to MEMS devices, which have been built up on the basis of semiconductor processes, using PCB materials for forming the described support structure may have the advantage that with one single piece of PCB panel a much higher number of MEMS devices can be formed simultaneously. This significantly reduces the production costs for each individual MEMS device.

According to a further embodiment of the invention the method further comprises forming a component carrier, in particular a PCB, wherein the component carrier and the support structure are formed with the same PCB manufacturing process such that the support structure is mounted to the component carrier. This may provide the advantage that predominantly with well-established PCB manufacturing processes a MEMS assembly can be formed which can be used as a MEMS module acting either as a MEMS actuator or a MEMS sensor.

As has already been mentioned above such a module may comprise appropriate electronic circuitry, which can be mounted, for instance surface mounted, at and/or embedded within the component carrier. Depending on the specific application such electronic circuitry either drives the MEMS device respectively the piezoelectric transducer of the MEMS device (in an actuator like application) or receives and, if applicable also processes, measurement signals produced by the MEMS device (sensor application).

According to a further embodiment of the invention forming the support structure and forming the piezoelectric transducer comprises sandwiching the piezoelectric transducer in between a lower part of the support structure and an upper part of the support structure. This may provide the advantage that the MEMS device can be formed in an easy and effective manner.

According to a further embodiment of the invention the method further comprises (a) forming an opening within the lower part in order to expose an interaction portion of the piezoelectric transducer and/or (b) forming a further opening within the upper part in order to expose a further interaction portion of the piezoelectric transducer.

As has already been mentioned above, with the opening(s) the respective interaction portion of the piezoelectric transducer can establish a direct mechanical interaction with a physical quantity characterizing the actual state of the environment of the MEMS device.

According to a further embodiment of the invention forming the opening and/or forming the further opening is carried out by means of a plasma etching procedure and/or a laser treatment procedure, in particular a laser ablation procedure. This may provide the advantage that a precise formation of the opening and/or of the further opening can be realized. Since both plasma etching and laser ablation of PCB materials is an approved and well-known procedure, there is no need to develop a specific opening formation procedure in order to realize the described MEMS device.

According to a further embodiment of the invention (a) between the piezoelectric transducer and the lower part of the support structure there is provided a lower release layer and/or (b) between the piezoelectric transducer and the upper part of the support structure there is provided an upper release layer. This may provide the advantage that the opening and/or the further opening can be formed by a laser cutting procedure, wherein a cutting laser beam is guided along a circumference or a perimeter of the opening such that a portion of the respective part of the support structure, which portion corresponds to the respective opening, will be cut out. The remaining cutout piece can then easily be removed from the piezoelectric transducer.

The lower and/or the upper release layer may be made of any material which is known in PCB manufacturing and which prevents an unwanted (strong) adhesion between two layers. The lower and/or the upper release layer may be for instance a wax layer.

Preferably, the lower and/or the upper release layer does/do not extend laterally until the ends or edges of the stack comprising the support structure and the piezoelectric transducer. It is only necessary that the respective release layer laterally extends along the entire width of the opening. This has the positive effect that in the final MEMS device the piezoelectric transducer will stay firmly attached or adhered to the remaining support structure (without the cutout corresponding to the opening).

According to a further embodiment of the invention the piezoelectric transducer is a stack of at least one layer of aluminum nitride (AlN) and at least one layer of copper (Cu).

As has already been described above, AlN exhibits a very good adhesion to Cu, which is a widely used PCB material. This may result in an improved adhesion of the piezoelectric transducer to the support structure. This holds in particular for the above described embodiment where the AlN/Cu piezoelectric transducer is sandwiched between two parts of the support structure.

It has to be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this document.

The aspects defined above and further aspects of the present invention are apparent from the examples of embodiment to be described hereinafter and are explained with reference to the examples of embodiment. Embodiments of the invention will be described in more detail hereinafter with reference to examples of embodiment but to which the invention is not limited.

DETAILED DESCRIPTION OF ILLUSTRATED EMBODIMENTS

Figure 1A:
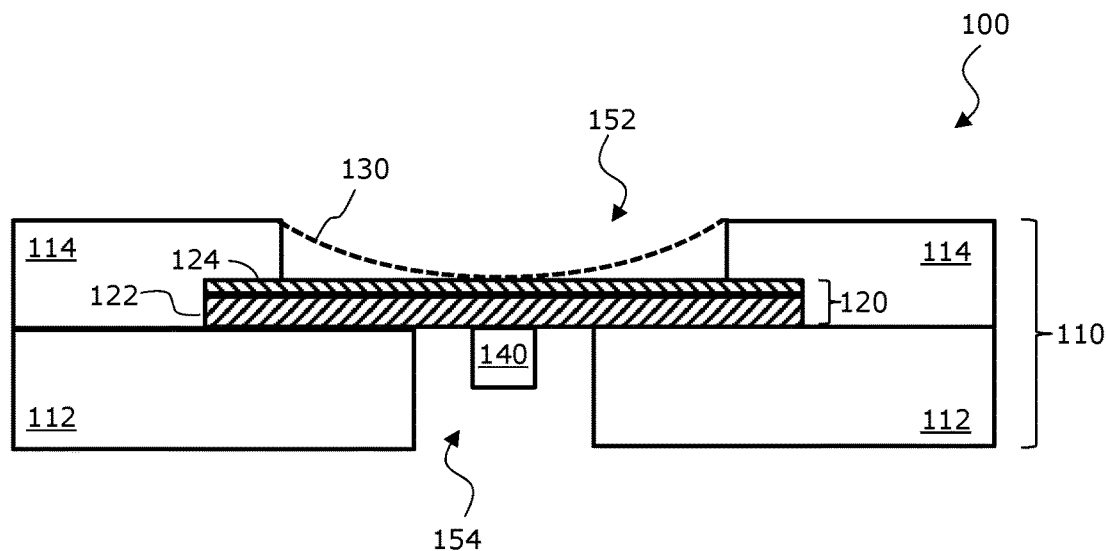
FIG. 1A shows a cross sectional view of a MEMS device in accordance with an embodiment of the invention.

The illustration in the drawing is schematic. It is noted that in different figures, similar or identical elements or features are provided with the same reference signs. In order to avoid unnecessary repetitions elements or features which have already been elucidated with respect to a previously described embodiment are not elucidated again at a later position of the description.

Further, spatially relative terms, such as "front" and "back", "above" and "below", "left" and "right", et cetera are used to describe an element's relationship to another element(s) as illustrated in the figures. Thus, the spatially relative terms may apply to orientations in use which differ from the orientation depicted in the figures. Obviously all such spatially relative terms refer to the orientation shown in the figures only for ease of description and are not necessarily limiting as an apparatus according to an embodiment of the invention can assume orientations different than those illustrated in the figures when in use.

FIG. 1A shows a cross sectional view of a MEMS device 100 which can be used as a microphone or as a loudspeaker. The application of the MEMS device 100 depends whether mechanic or acoustic energy is converted into an electric quantity or vice versa an electric quantity such as a driving voltage or a current is converted into vibrational or acoustic energy.

The MEMS device 100 comprises a support structure 110, which according to the embodiment described here is a stack of two FR4 material layers 112 and 114. In order to avoid mechanical stress within the MEMS device 100 the FR4 material is a low CTE FR4 material. The layers 112 and 114 could also be seen as PCB core layers.

In between the two FR4 layers 112, 114 there is formed a piezoelectric transducer 120. The piezoelectric transducer 120 is a layered structure which comprises a piezoelectric material layer 122 and a metal layer 124. According to the exemplary embodiment described here the piezoelectric material layer 122 is made from AlN and the metal layer 124 is made from Cu.

In order to expose the piezoelectric transducer 120 to the environment of the MEMS device 100, there are provided two openings. An (upper) opening 152 is formed within the FR4 layer 114 and a (lower) further opening 154 is formed within the FR4 layer 112. A membrane 130 spans the opening 152, wherein the center portion of the membrane 130 is mechanically connected to the piezoelectric transducer 120. According to the exemplary embodiment described here the membrane 130 is made from silicone. Alternatively, materials having in particular similar elastic properties may be used. In certain applications, even the material Polycrystalline Si may be used, which is may be however more difficult to process. An inertial element 140, which represents a vibrating mass, is located within the (lower) further opening 154 and is attached to the bottom side of the piezoelectric transducer 120.

Descriptively speaking, the MEMS device 100 represents an idealized microphone/loudspeaker which utilizes the FR4 cores 112, 114 as a (PCB) substrate. Due to the use of Polycrystalline Si material for the membrane 130 the MEMS device 100 is a typical build-up of a MEMS microphone or MEMS loudspeaker based on Si. Thermal induced mechanical stress between the membrane 130 and the FR4 core 114 is minimized by using an FR4 material which has a low Coefficient of Thermal Expansion (CTE). The depicted Si-based MEMS device 100 is a piezoelectric MEMS device. This means that the electric quantity being associated with the operation is a voltage rather than a current. In a microphone application vibrations of the membrane 130 produce an electrical voltage signal for a read out by a non-depicted electronic circuitry. In a loudspeaker application, an electrical voltage signal drives the piezoelectric transducer 110. The resulting vibrations of the piezoelectric transducer 110 are mechanically transferred to the membrane 130, which itself generates acoustic waves.

The piezoelectric transducer 110 together with the inertial element 140 represent a spring-mass system, the vibration of which is either detected or generated by the piezoelectric transducer. It is pointed out that depending on the specific design and/or the application of the MEMS device 100 the inertial element 140 and/or the membrane 130 are optional components.

Also the piezoelectric material AlN 122 can be applied via a sputtering process directly onto a FR4 material, in the described embodiment the AlN is applied to the Cu layer 124 before the FR4 core layers 114 of the MEMS device 100 are attached to each other by pressing them together in particular by means of a one-shot process.

Figure 1B:
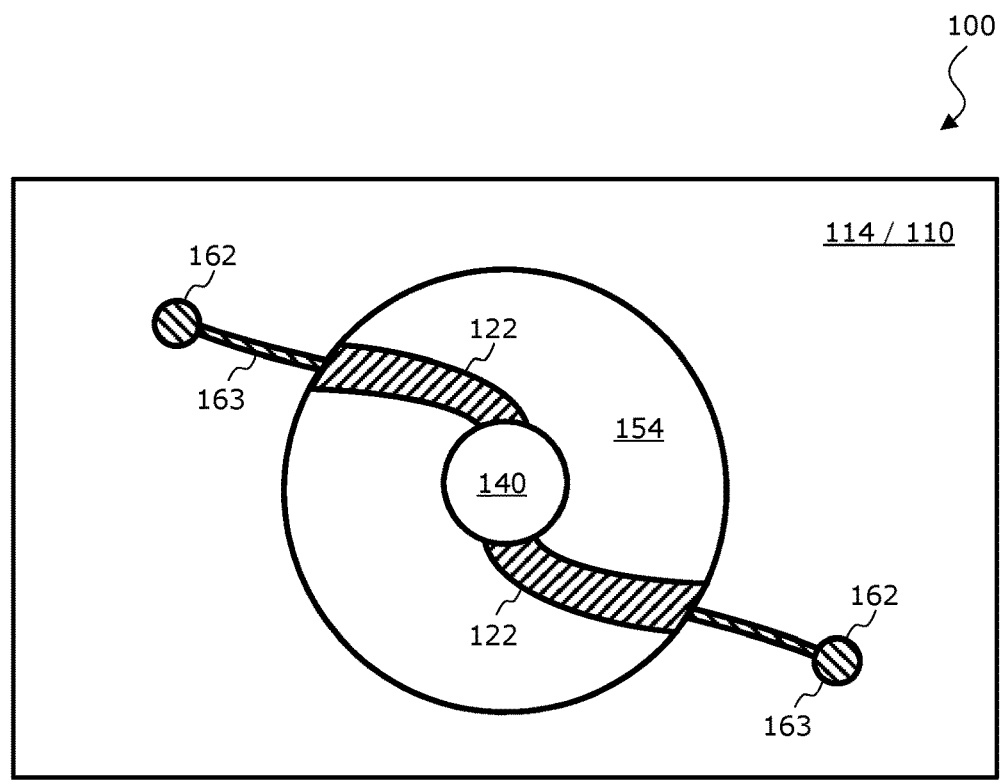
FIG. 1B is a bottom view MEMS device shown in FIG. 1A.

FIG. 1B is a bottom view of the MEMS device 100. According to the embodiment described here the AlN material, which in a loudspeaker application represents an actuator, is spatially structured from a planar AlN layer such that two bent arms of AlN material are produced. Respectively one of these two bent arms is electrically contacted via an electric contact 162 and a corresponding conductor trace 163 formed on the FR4 material layer 112. According to the embodiment described here, the electric contacts 162 and the conductor traces 163 are made from an appropriate structured Cu layer, which for the sake of clarity is not depicted in FIG. 1A.

As can be seen from FIG. 1B, according to the embodiment described here the further opening 154 has a circular shape. However, it is mentioned that the described MEMS device can also be realized with an opening which has another shape such as e.g. a rectangular or a quadratic shape. The same holds for the shape of the opening 152 which can only be seen in FIG. 1A.

Figure 2:
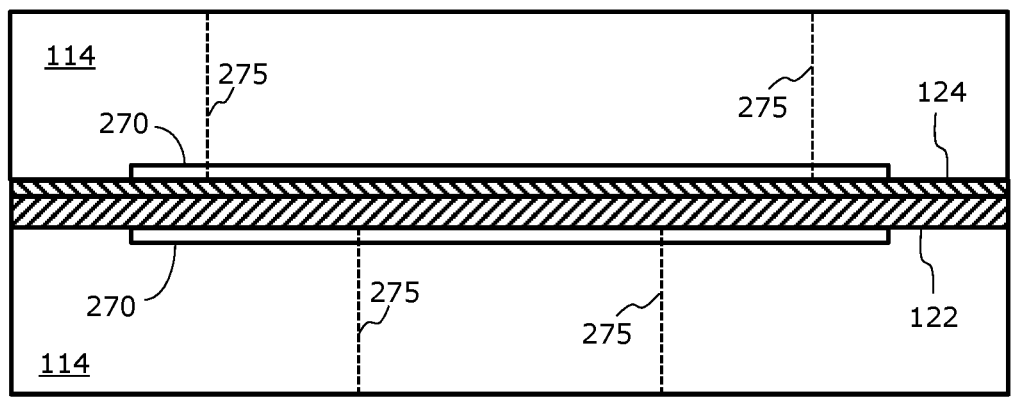
FIG. 2 illustrates a production of the MEMS device, wherein release layers are used in order to allow for an easy and effective formation of openings exposing a piezoelectric transducer of the MEMS device.

FIG. 2 illustrates an intermediate state when producing the MEMS device 100 in an effective manner. Specifically, two release layers 270 are employed, wherein an upper release layer 270 is formed between the Cu layer 124 and the upper FR4 core 114 whereas the lower release layer 270 is formed between the AlN layer 122 and the lower FR4 core 114. As can be seen from FIG. 2, the two release layers 270 laterally extend beyond respective laser cut lines 275 which define the size of the two openings 152 and 154, which are depicted best in FIG. 1A. For forming these two openings 152 and 154 a laser beam is guided along a circular line on the respective surface of the FR4 core 114. The processing power of the laser beam is chosen such that, when being guided along the circular line for a predetermined number of times, along a vertical z-direction the respective circular cut extends from the outer surface of the respective FR4 core 114 to the respective release layer 270. Thereby, a cylindrical cut out corresponding to the size of the respective opening is produced which cylindrical cut out can be detached from the remaining MEMS device 100 easily (the two release layers 270 prevent adhesion).

Figure 3:
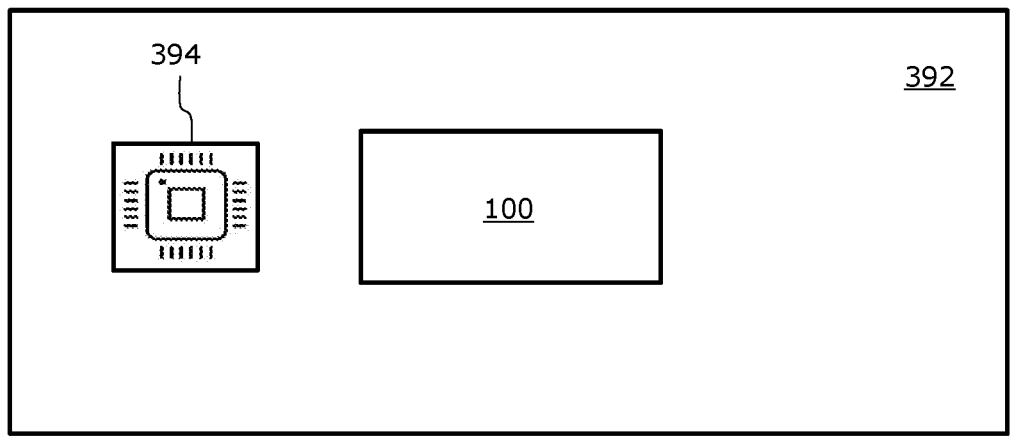
FIG. 3 shows a MEMS arrangement comprising a component carrier and a MEMS device formed thereon.

FIG. 3 shows a MEMS arrangement 390 comprising a component carrier 392 and a MEMS device 100 formed thereon. According to the embodiment described here the component carrier 392 is a PCB onto which an electronic circuit 394 is assembled. In case of a loudspeaker application an electrical signal generated or forwarded by the electronic circuit 394 is applied to the piezoelectric transducer 120 of the MEMS device 100. In a microphone application, vibrations of the membrane 130 produce an electrical signal which is received by the electronic circuit 394.

It should be noted that the term "comprising" does not exclude other elements or steps and the use of articles "a" or "an" does not exclude a plurality. Also elements described in association with different embodiments may be combined. It should also be noted that reference signs in the claims should not be construed as limiting the scope of the claims.

LIST OF REFERENCE SIGNS

100 MEMS device
110 support structure
112 PCB core/(low CTE) FR4
114 PCB core/(low CTE) FR4
120 piezoelectric transducer
122 piezoelectric Material, AlN
124 metal layer/Cu layer
130 membrane/doped Poly-Silicon
140 inertial element/mass
152 opening
154 further opening
162 electric contact
163 conductor trace
270 release layer
275 laser cut lines
390 MEMS assembly
392 component carrier/PCB
394 electronic circuit

The invention claimed is:

1. A microelectromechanical system, MEMS, device, comprising:
   a support structure formed of printed circuit board, PCB, materials; and
   a piezoelectric transducer formed at the support structure, wherein the piezoelectric transducer is formed between two layers made from a FR4 material or between two epoxy-based build-up films and the piezoelectric transducer is electrically contacted via conductor traces formed on one of the two layers.

2. The MEMS device as set forth in claim 1, wherein at least one of the PCB materials comprises a linear coefficient of thermal expansion (CTE) at 20° C. being in the range between 2.0×10-6/K and 3.1×10-6/K.

3. The MEMS device as set forth in claim 1, wherein the piezoelectric transducer is made at least partially from aluminum nitride (AlN).

4. The MEMS device as set forth in claim 3, wherein the MEMS device further comprises a layer of copper (Cu), wherein AlN is formed at the layer of Cu.

5. The MEMS device as set forth in claim 1, wherein the piezoelectric transducer is a layer structure which is embedded within the support structure.

6. The MEMS device as set forth in claim 1, further comprising:
an opening which is formed within the support structure and which is designed in such a manner that an interaction portion of the piezoelectric transducer is exposed to an external environment of the MEMS device.

7. The MEMS device as set forth in claim 6, wherein the MEMS device further comprises:
a further opening which is formed within the support structure and which is designed in such a manner that a further interaction portion of the piezoelectric transducer is exposed to the external environment or to a further external environment of the MEMS device, wherein with respect to a main plane of the layer structure of the piezoelectric transducer the interaction portion and the further interaction portion are located at opposite sides.

8. The MEMS device as set forth in claim 6, further comprising:
a flexible membrane spanning the opening, wherein at least a portion of the membrane is mechanically coupled with or is coupleable to the piezoelectric transducer.

9. The MEMS device as set forth in claim 8, wherein the flexible membrane comprises at least one of silicone and Polycrystalline Si.

10. The MEMS device as set forth in claim 1, further comprising:
an inertial element which is attached to the interaction portion of the piezoelectric transducer.

11. The MEMS device as set forth in claim 1, wherein at least one of the PCB materials comprises a modulus of elasticity which is smaller than the modulus of elasticity of silicon.

12. The MEMS device as set forth in claim 1, wherein the conductor traces are made from a structured copper layer.

13. A microelectromechanical system (MEMS) assembly, comprising:
a component carrier; and
a MEMS device having a support structure formed of printed circuit board (PCB) materials with a piezoelectric transducer formed between two layers of a FR4 material or between two epoxy-based build-up films and with the piezoelectric transducer electrically contacted via conductor traces formed on one of the two layers, wherein the MEMS device is mounted at the component carrier.

14. The MEMS assembly as set forth in claim 13, further comprising:
an electronic circuit, which is mounted at the component carrier and which is electrically connected with the MEMS device.

15. A method for manufacturing a microelectromechanical system (MEMS) device, the method comprising:
forming a support structure from printed circuit board (PCB) materials by using PCB manufacturing procedures;
forming a piezoelectric transducer between two layers of a FR4 material or between two epoxy-based build-up films at the support structure; and
electrically contacting the piezoelectric transducer with conductor traces formed on one of the two layers.

16. The method as set forth in claim 15, further comprising:
forming a component carrier;
wherein the component carrier and the support structure are formed with the same PCB manufacturing process such that the support structure is mounted to the component carrier.

17. The method as set forth in claim 15, wherein forming the support structure and forming the piezoelectric transducer further comprises:
sandwiching the piezoelectric transducer between a lower part of the support structure and an upper part of the support structure.

18. The method as set forth in claim 15, the method further comprising:
forming an opening within the lower part in order to expose an interaction portion of the piezoelectric transducer; and/or
forming a further opening within the upper part in order to expose a further interaction portion of the piezoelectric transducer.

19. The method as set forth in claim 15, wherein the method is characterized by at least one of the following features:
between the piezoelectric transducer and the lower part of the support structure there is provided a lower release layer; and
between the piezoelectric transducer and the upper part of the support structure there is provided an upper release layer.

20. The method as set forth in claim 15, wherein the piezoelectric transducer is a stack of at least one layer of aluminum nitride (AlN) and at least one layer of copper (Cu).

* * * * *